(12) United States Patent
Tanaka

(10) Patent No.: US 10,607,872 B2
(45) Date of Patent: Mar. 31, 2020

(54) CONTAINER STORAGE FACILITY

(71) Applicant: Daifuku Co., Ltd., Osaka-shi (JP)

(72) Inventor: Kenichi Tanaka, Hinocho (JP)

(73) Assignee: Daifuku Co., Ltd., Osaka-shi (JP)

(*) Notice: Subject to any disclaimer, the term of this patent is extended or adjusted under 35 U.S.C. 154(b) by 20 days.

(21) Appl. No.: 15/697,752

(22) Filed: Sep. 7, 2017

(65) Prior Publication Data

US 2018/0076078 A1    Mar. 15, 2018

(30) Foreign Application Priority Data

Sep. 9, 2016 (JP) .................................. 2016-176969

(51) Int. Cl.
*H01L 21/677* (2006.01)
*H01L 21/67* (2006.01)
*H01L 21/673* (2006.01)

(52) U.S. Cl.
CPC .. *H01L 21/67769* (2013.01); *H01L 21/67017* (2013.01); *H01L 21/67393* (2013.01)

(58) Field of Classification Search
CPC .......... B25J 1/06; B25J 9/0025; B25J 9/0004; H01L 21/67769
See application file for complete search history.

(56) References Cited

U.S. PATENT DOCUMENTS

2002/0174709 A1* 11/2002 Kim ..................... G01N 1/2273
73/31.01
2016/0370795 A1* 12/2016 Musselman .......... G05B 19/418

FOREIGN PATENT DOCUMENTS

| JP | 48113 A | 1/1992 |
| JP | 2013139318 A | 7/2013 |
| JP | 2014241377 A | 12/2014 |
| JP | 201565259 A | 4/2015 |

* cited by examiner

*Primary Examiner* — Saul Rodriguez
*Assistant Examiner* — Willie Berry, Jr.
(74) *Attorney, Agent, or Firm* — The Webb Law Firm

(57) ABSTRACT

A facility comprises an inactive gas supplying device configured to supply inert gas to a container, a transport device configured to carry a container into, and out of, a storage section, a first controller configured to control the transport device, a second controller configured to control the inactive gas supplying device, and a third controller configured to transmit a first command to the first controller through a communications relay device, and to transmit a second command to the second controller Hp. The transport device receives electric power from the first electric power supply whereas the inactive gas supplying device, the second controller, the third controller, and the communications relay device receive electric power from one or more different-path electric power supplies each of which is different from the first electric power supply.

3 Claims, 6 Drawing Sheets

CONTAINER STORAGE FACILITY

CROSS-REFERENCE TO RELATED APPLICATION

This application claims priority to Japanese Patent Application No. 2016-176969 filed Sep. 9, 2016, the disclosure of which is hereby incorporated in its entirety by reference.

FIELD OF THE INVENTION

The present invention relates to a container storage facility comprising a storage section configured to store a container for holding one or more semiconductor substrates, an inactive gas supplying device configured to supply inert gas to a container stored in the storage section, transport device configured to carry a container into, and out of, the storage section.

BACKGROUND

A conventional example of such a container storage facility is disclosed in JP Publication of Application No. 2014-241377 (Patent Document 1). This container storage facility comprises a container storage structure having a storage rack that includes a plurality of storage sections arranged one above another along the vertical direction with each storage section adapted to store a container for holding a plurality of semiconductor substrates, and a transport device for transporting containers, one container at a time, between any of the storage locations and a carry in and out location. And inactive gas supplying devices which supply inert gas to the interior of the containers are provided to the plurality of storage sections of the container storage structure. Therefore, a container storage facility with an inert gas supplying function is disclosed in Patent Document 1.

The container storage facility of Patent Document 1 includes a first controller for controlling the operation of the transport device, and a second controller for controlling the operations of the inactive gas supplying devices. In addition, the inactive gas supplying device is configured such that the supplying state of inert gas can be changed. Therefore, the container storage facility of Patent Document 1 can properly supply inert gas to any of the containers based on, among other factors, the elapsed time since the container is brought to, and stored in, a storage section.

In addition, the storage rack of the container storage facility of Patent Document 1 is provided in an internal space which is isolated from the external space by walls. And a wall is provided with a door for a worker to enter and exit the facility. When the door is opened to allow a worker to enter the internal space, the second controller controls the inactive gas supplying devices to stop supplying the inert gas, in order to reduce the lowering of the oxygen concentration in the internal space.

The container storage facility of Patent Document 1 is provided with a third controller which issues commands to the second controller for causing the second controller to operate the inactive gas supplying devices. When the door is closed and thus inert gas can be supplied, the third controller issues a command to the second controller for resumption of the supplying of inert gas. This arrangement ensures the safety of a worker when entering the internal space and facilitates prevention of deterioration of the semiconductor substrates in the stored containers. Note that each of the first controller, the second controller, and the third controller consists of a separate computer and that these computers transmit and receive information to and from each other through one or more communications relay devices (hub etc.).

While not described in Patent Document 1, a container storage facility with the inert gas supplying function, such as one disclosed in Patent Document 1, can also be obtained by retrofitting inactive gas supplying devices to a container storage facility which was not originally equipped with these inactive gas supplying devices.

FIG. 6 of the present application shows the connections and electric power supply paths between various devices provided to the container storage facility obtained by retrofitting the inactive gas supplying device. FIG. 6 shows a container storage facility including two container storage structures J (first container storage structure J1 and second container storage structure J2) with the electric power supply paths shown with dashed lines.

The purging devices 20 (first purging device 20A and second purging device 20B) that function as inactive gas supplying devices and the second controllers Hp (first-storage-structure-side second controller Hp1 and second-storage-structure-side second controller Hp2) require relatively large amount of electric power. Thus, the container storage facility is retrofitted with distribution boards Pb for purging (distribution board P1$b$ for purging in the first storage structure and distribution board P2$b$ for purging in the second storage structure) which are electric power supplies provided separately from the distribution boards Pa for transporting (distribution board P1$a$ for transporting in the first storage structure and distribution board P2$a$ for transporting in the second storage structure) which are existing electric power supplies. In this case, it is preferable that each distribution board Pb for purging is powered through a different electric power supply path from the electric power supply path for the distribution board Pa for transporting. In terms of the components shown in FIG. 6, the container storage facility is retrofitted with distribution boards Pb for purging which are provided separately from the distribution boards Pa for transporting which are electric power supplies for supplying the operational electric power to the stacker cranes 10 (first stacker crane 10A and second stacker crane 10B) which function as transport devices and to the first controllers Hs (first-storage-structure-side first controller Hs1 and second-storage-structure-side first controller Hs2). And each distribution board Pb for purging is powered through an electric power supply path that is different from the electric power supply path for the distribution board Pa for transporting.

The hubs Ca (first hub Ca1 and second hub Ca2) for relaying communication signals between controllers may be connected to, and powered by the electric power supplied by, respective distribution boards Pa for transporting if there is any additional communication port available.

SUMMARY OF THE INVENTION

With the container storage facility as described above, if supplying electric power to the stacker crane 10 becomes impossible due to a failure of the distribution board Pa for transporting, then the stacker crane 10 cannot be operated, making it impossible for the containers to be retrieved, or taken out, from the storage sections. Further, since electric power is no longer supplied to the hub Ca, the third controller cannot transmit the command for operating the purging device 20 to the second controller Hp, making it impossible to supply inert gas to the containers stored in the storage sections. Therefore, when an abnormal condition occurs in the electric power supply system for the facility, inert gas cannot be supplied to the containers stored in the storage sections, causing possible deterioration of the substrates in the containers. In addition, since these containers cannot be taken out of the storage sections, it becomes impossible to take necessary actions.

Therefore, a container storage facility is desired which can reduce any likelihood of deterioration of the substrate in a container even when an abnormal condition occurs in the electric power supply system for the facility.

The container storage facility in accordance with the present disclosure comprises a storage section configured to store a container for holding one or more semiconductor substrates; an inactive gas supplying device configured to supply inert gas to a container stored in the storage section; a transport device configured to carry a container into, and out of, the storage section; a first controller configured to control operation of the transport device; a second controller configured to control operation of the inactive gas supplying device; and a third controller configured to transmit a first command to the first controller through a communications relay device, and to transmit a second command to the second controller through the communications relay device, wherein the first command is a command related to an operation of the transport device, wherein the second command is a command related to an operation of the inactive gas supplying device, wherein the transport device is configured to operates with electric power supplied from a first electric power supply, and wherein the inactive gas supplying device, the second controller, the third controller, and the communications relay device are configured to operate with electric power supplied from one or more different-path electric power supplies each of which is an electric power supply to which electric power is supplied through corresponding one or more electric power supply paths each of which is different from an electric power supply path for supplying electric power to the first electric power supply.

That is, each of the inactive gas supplying device, the second controller, the third controller, and the communications relay device operates with electric power supplied from the one or more different-path electric power supplies. Thus, even if any abnormal condition occurs in the first electric power supply and thus the first electric power supply becomes unable to supply electric power, the inactive gas supplying device can be operated by a command from the third controller.

Therefore, even if it becomes impossible to take out a container from a storage section because the transport device cannot operate because of the abnormal condition that occurred in first electric power supply, inert gas can still be supplied to the container in the storage section by the inactive gas supplying device until the first electric power supply is restored so that it can supply electric power normally. Thus, any likelihood of deterioration of the one or more substrates in the container can be reduced.

Therefore, with the arrangement described above, any likelihood of deterioration of the one or more substrates in the container can be reduced even when an abnormal condition occurs in the electric power supply system for the facility.

DETAILED DESCRIPTION

Embodiments of a container storage facility are described next with reference to the drawings.

Figure 3:
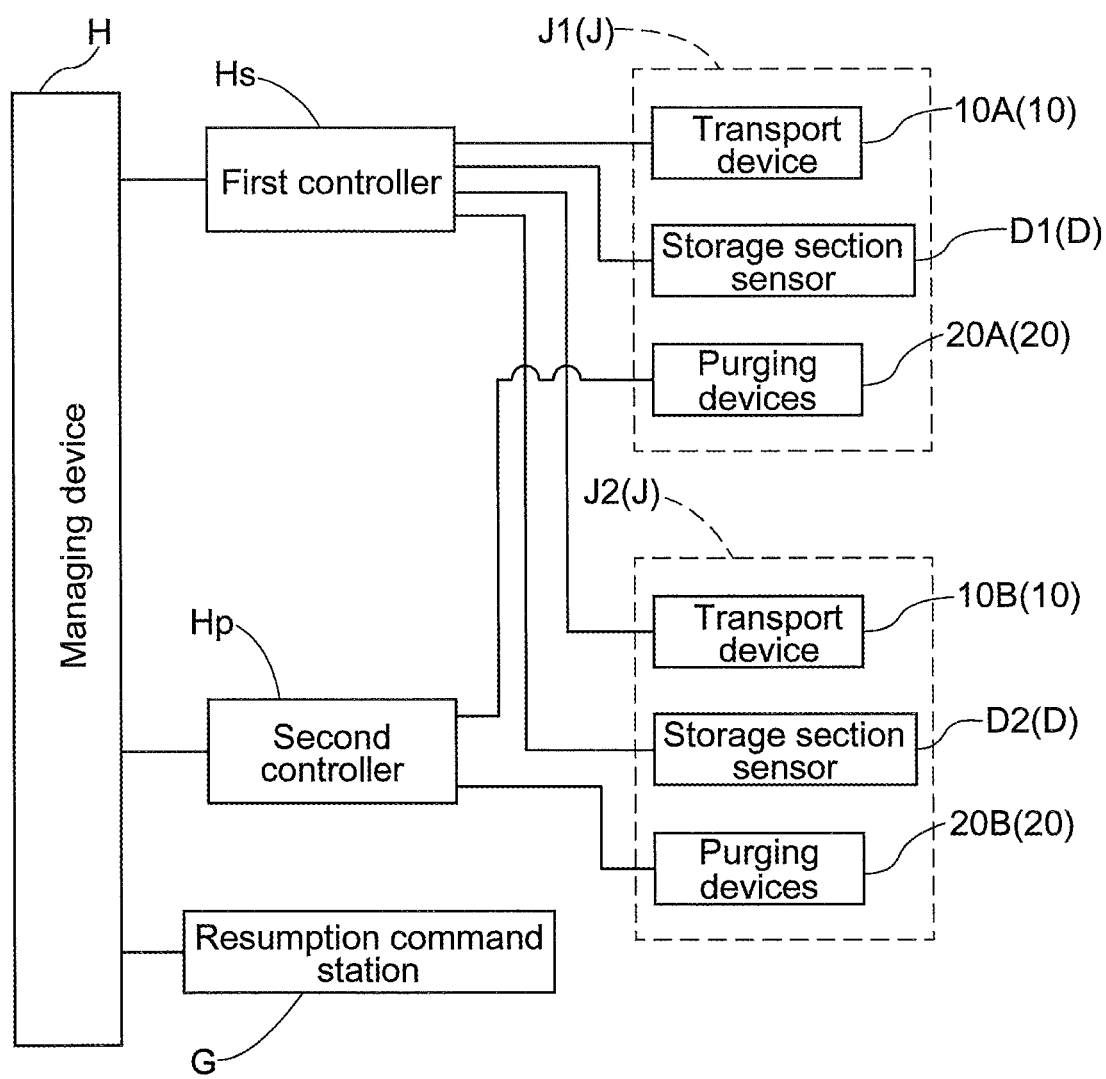
FIG. 3 is a block diagram showing the control-related arrangement of the container storage structure.
Figure 4:
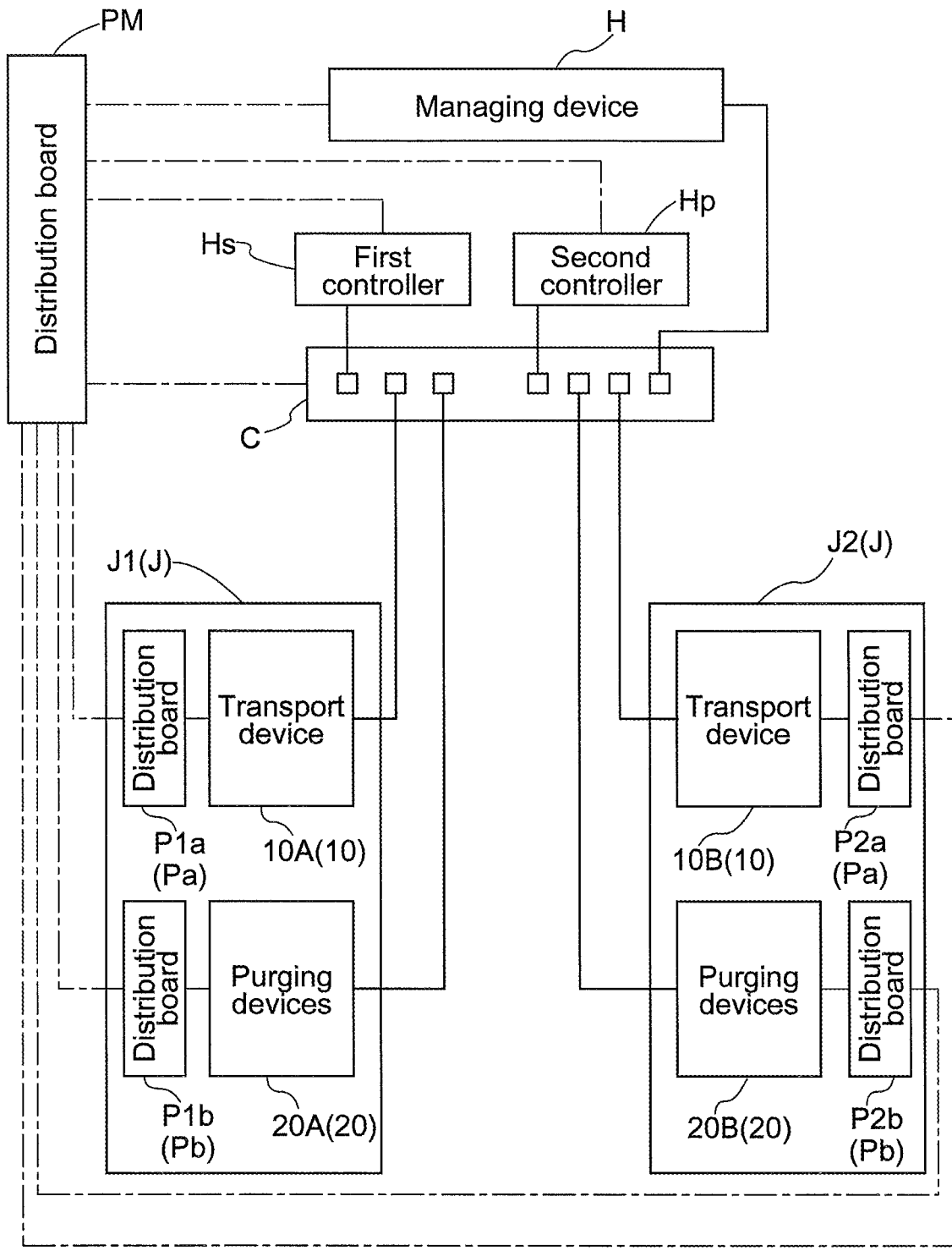
FIG. 4 is a block diagram showing electric power supply paths for the container storage structure.

As shown in FIGS. 3 and 4, the container storage facility of the present embodiment includes two container storage structures J (a first container storage structure J1 and a second container storage structure J2), a first controller Hs, a second controller Hp, and a managing device H.

Figure 1:
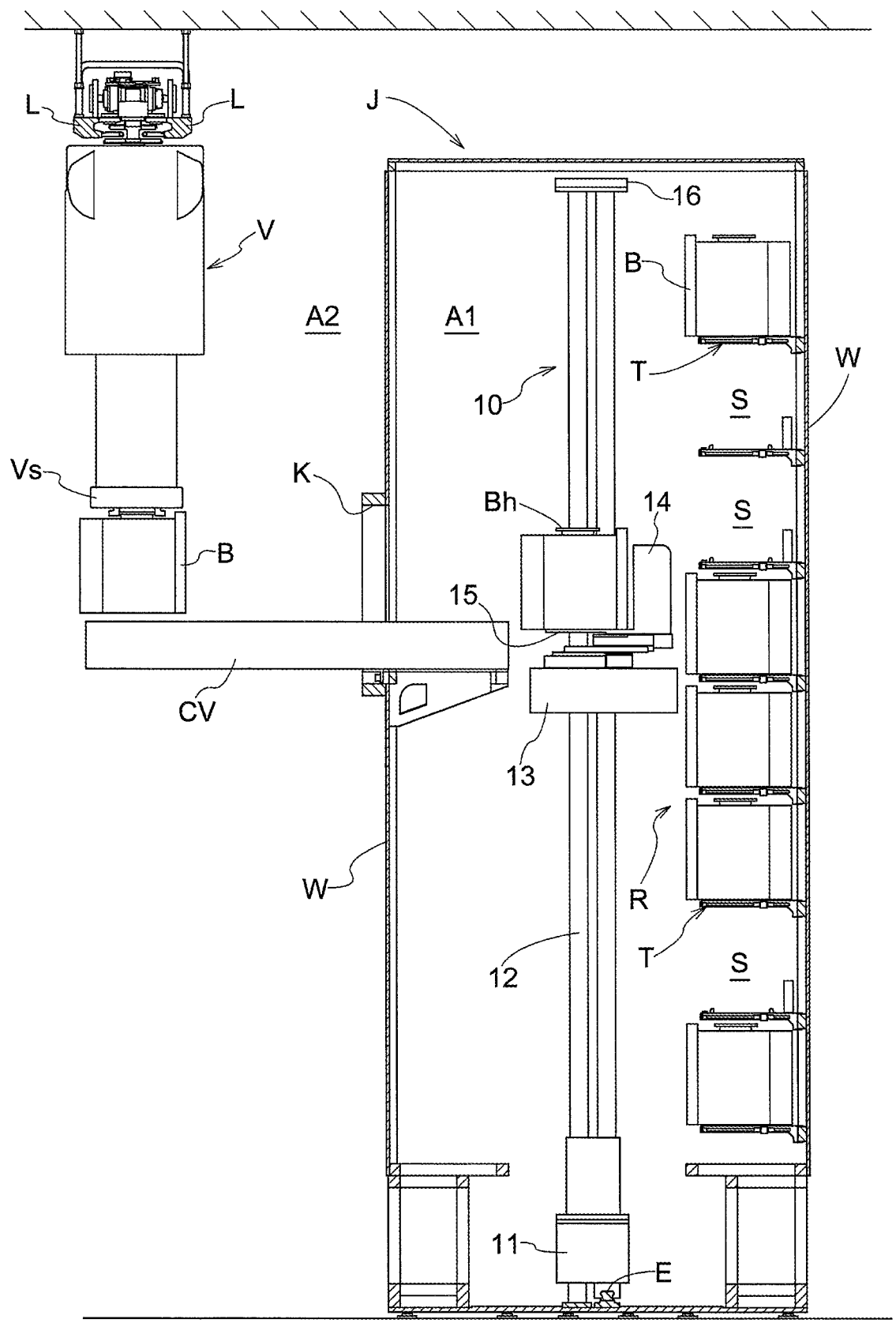
FIG. 1 is a sectional view of a container storage structure
Figure 2:
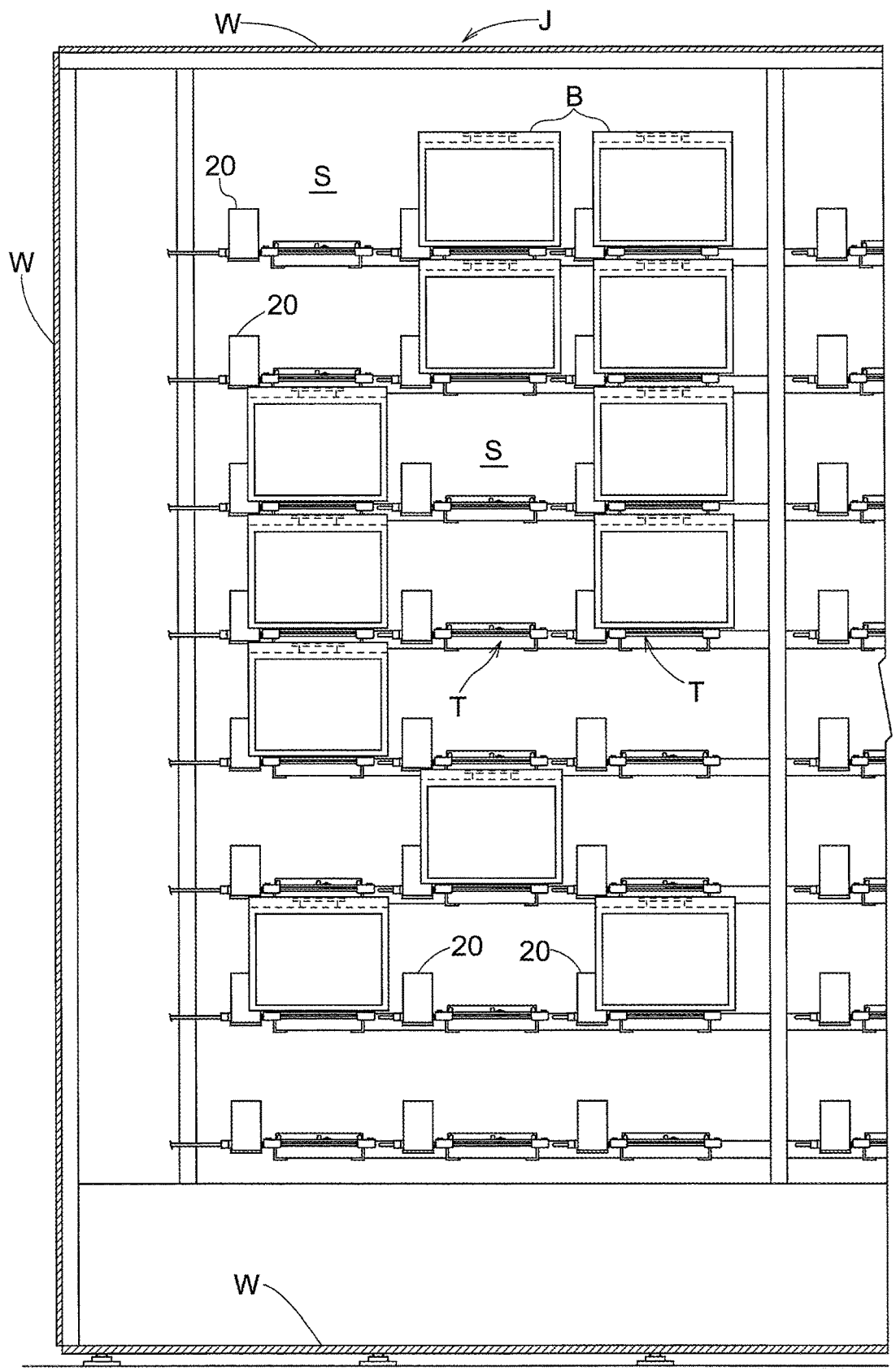
FIG. 2 is a front view of an important portion of the container storage structure.

As shown in FIGS. 1 and 2, each container storage structure J includes a storage rack R configured to store containers B each configured to hold one or more substrates under a sealed condition, a stacker crane 10 which functions as a transporting device configured to transport the containers B, one container B at a time, and one or more carry-in-and-out conveyors CV which function as carry in and out portions for the containers B. As shown in FIGS. 3 and 4, in the present embodiment, two container storage structures J (first container storage structure J1 and second container storage structure J2) are provided. The first container storage structure J1 includes a first stacker crane 10A and first purging devices 20A. The second container storage structure J2 includes a second stacker crane 10B and second purging devices 20B. In addition, the first container storage structure J1 and the second container storage structure J2 have an almost identical structure. Accordingly, in the following description, when the two container storage structures J and components and/or devices provided to either of the two structures do not need to be distinguished, one of first container storage structure J1 and the second container storage structure J2 is described as the container storage structure J. The associated one of the first stacker crane 10A and the second stacker crane 10B is described as the stacker crane 10. And the associated ones of the first purging devices 20A and the second purging devices 20B are described as the purging devices 20.

As shown in FIGS. 1 and 2, the storage rack R and the stacker crane 10 are installed or located in an internal space A1 whose perimeter is covered and defined by walls W. Each of the one or more of the carry-in-and-out conveyors CV is provided to extend through an opening K formed in a wall W so that it extends between the internal space A1 and an exterior space A2.

The storage rack R has a plurality of storage sections S each configured to store a container B with the storage sections S arranged one above another along a vertical direction and one next to another along a right-and-left (or lateral) direction. Each of the plurality of storage sections S has a shelf member T configured to support a single container B.

In the present embodiment, as shown in FIG. 1, one or more hoist type transport vehicles V are provided, each of which is configured to travel along a pair of rails L that are suspended from, and supported by, a ceiling of a clean room in which the container storage structure J is installed. The transport vehicle V is configured to be capable of holding a container B and to be capable of transferring a container B to and from either of the one or more of the carry-in-and-out conveyors CV, by means of a grip portion Vs which can be raised and lowered, i.e., vertically moved.

Each container B is an airtight container which is made of synthetic resin and is commonly referred to as a FOUP (Front Opening Unified Pod) manufactured in compliance with the specification of SEMI (Semiconductor Equipment and Materials Institute). Such containers B are used to hold one or more semiconductor wafers as one or more substrates. While not described in detail, an opening, through which substrates are inserted and retrieved and which can be closed and left open by a detachable lid, is formed in the front face of the container B. And a top flange Bh configured to be gripped or held by the grip portion Vs of the transport vehicle V is formed, or otherwise provided, on the top surface of the container B.

In addition, while not shown, three engaging grooves, which positioning pins provided to each shelf member T engage, are formed in the bottom surface of each container B. Provided in the bottom portion of each container B are an intake opening for introducing nitrogen gas, which functions as inert gas, into the container B, and an outlet opening for allowing the gas inside the container B to be released or discharged.

While not shown, the intake opening is provided with an introducing side opening and closing valve whereas the outlet opening is provided with a discharging side opening and closing valve. The introducing side opening and closing valve is urged in the closing direction, i.e. toward its closed position, by an urging means or member, such as a coil spring. The introducing side opening and closing valve is configured such that, if the pressure of the inert gas supplied to and discharged into the intake opening is greater than or equal to a set valve opening pressure which is greater than the atmospheric pressure by values greater than or equal to a set value, then the introducing side opening and closing valve is opened by that pressure. In addition, the discharging side opening and closing valve is urged in the closing direction, i.e. toward its closed position, by an urging means or member, such as a coil spring. The discharging side opening and closing valve is configured such that, if the pressure inside the container B is greater than a set valve opening pressure which is greater than the atmospheric pressure by values greater than or equal to a set value, the discharging side opening and closing valve is opened by that pressure.

As shown in FIG. 1, the stacker crane 10 includes a travel carriage 11 capable of traveling along a travel rail E provided on a floor portion of the container storage structure J, a mast 12 fixed and arranged vertically on the travel carriage 11, and a vertically movable platform 13 which is capable of being vertically moved, or being raised and lowered while being guided by the mast 12. In addition, an upper frame member 16 provided at the upper end of the mast 12 is configured to be moved while in engagement with an upper guide rail (not shown) provided in a ceiling portion of the container storage structure J.

The vertically movable platform 13 is provided with a transfer device 14 configured to transfer a container B to or from the shelf member T of any one of the storage sections S. The transfer device 14 includes a plate-shaped (i.e., generally flat and thin) receiving and supporting member 15 configured to receive and support a container B such that the receiving and supporting member 15 can be projected to a projected position at which it is projected (i.e. in a projected state) toward the storage section S side and can be retracted to a retracted position at which it is retracted (i.e., in a retracted state) toward a vertically movable platform 13 side.

The transfer device 14 is configured to perform an unloading operation for unloading the container B placed on the receiving and supporting member 15 to a storage section S and a pick up operation for retrieving a container B stored in a storage section S, through a projecting and retracting operation of the receiving and supporting member 15 as well as a vertical movement operation of the vertically movable platform 13. Note that the operation of the stacker crane 10 is controlled by the first controller Hs (see FIGS. 3 and 4) described below.

In addition, a storage section sensor D (see FIG. 3) configured to detect whether the state of the container B is abnormal is provided to each shelf member T. The storage section sensors D are collectively configured to be capable of detecting various kinds of abnormal conditions of the container storage structure J (other than abnormal conditions of the purging device 20 described below) such as an abnormal condition of an electric power supplying state to the stacker crane 10 for transporting containers B to the storage sections S, and an abnormal condition of the supporting position of a container B on the shelf member T, etc. The storage section sensor D provided to a shelf member T may be any conventional position sensor, such as a contact sensor, so positioned to be activated when a container B is placed in a correct position and in correct posture on the shelf member T. Another storage section sensor D may be any conventional sensor, such as a voltage sensor, that can detect any abnormality in the power supplied to the stacker crane 10 or an acceleration sensor. In addition, the detection information detected by any of the storage section sensors D may be related to any one of the abnormal conditions mentioned above, or may be related to any abnormal condition in one or more of the storage sections S other than those mentioned above. As shown in FIG. 3, the detection information detected by any of the storage section sensors D is inputted to the first controller Hs described below. The first controller Hs is configured to transmit abnormal condition information (first abnormal condition information) to a second controller Hp (see FIG. 3, etc.) described below, based on the detection information detected by a storage section sensor D.

Each shelf member T is provided with a discharge opening configured to supply inert gas to inside of a container B, and a venting opening through which the gas released from inside the container B flows. When a container B is brought to be supported in the proper position on the shelf member T, the intake opening of the container B comes to be connected to the discharge opening of the shelf member T whereas the outlet opening of the container B comes to be connected to the venting opening of the shelf member T. A purging device 20 including a flow rate controller (which may be a mass flow controller) configured to control the flow rate of the inert gas supplied to the discharge opening is provided for and to each storage section S. Each of the plurality of purging devices 20 is connected to the second controller Hp. The operation of each purging device 20 is controlled by the second controller Hp. In addition, if inert gas is being supplied to the container B by the purging device 20 when the second controller Hp receives first abnormal condition information from the first controller Hs, the second controller Hp is configured to perform a stop operation at the time of an abnormal condition (referred to as "abnormal-condition-time stop operation" for short) for causing the operation of the purging device 20 to be stopped. Note that the abnormal-condition-time stop operation is performed in order to prevent the oxygen concentration in the internal space A1 from being reduced when a worker enters the internal space A1 of the container storage structure J for the purpose of checking the devices while a storage section sensor D detects an abnormal condition.

In the present embodiment, the stacker crane 10 is, or corresponds to, the transport device whereas a purging device 20 is, or corresponds to, an inactive gas supplying device.

That is, the container storage structure J in the container storage facility of the present embodiment includes one or more storage sections S each configured to store a container B configured to hold one or more substrates, a purging device 20 configured to supply inert gas to a container B stored in a storage section S, and a stacker crane 10 configured to carry containers B in, and out, of any of the storage sections S, one or more containers B at a time.

As shown in FIG. 4, each of the first controller Hs and the second controller Hp is connected to the managing device H by a communication wire through a switching hub C. In the present embodiment, the switching hub C is, or correspond to, the communications relay device whereas the managing device H is, or corresponds to, the third controller. Each of the various controllers and the managing device mentioned in the present specification may include a CPU, memory circuitry, and communication circuitry with algorithms stored in its memory to perform any necessary operations disclosed in the present specification. In addition, the switching hub C is connected to, through communication wires, a controller for the first stacker crane 10A in the first container storage structure J1, the controllers for the first purging devices 20A, a controller for the second stacker crane 10B in the second container storage structure J2, and the controllers for the second purging devices 20B.

The managing device H issues, to the first controller Hs, a first command which is a command related to an operation of the stacker crane 10 (i.e., an operation to carry a container B into, or out of, a specified storage section S). In addition, the managing device H issues, to the second controller Hp, a second command which is a command related to operations of one or more purging devices 20 (i.e., supplying or non-supplying of inert gas based on a specified supply flow rate and a specified supply period).

Based on a first command from the managing device H, the first controller Hs issues a command to the first stacker crane 10A in the first container storage structure J1, or the second stacker crane 10B in the second container storage structure J2, for the operation of the first or the second stacker crane 10A or 10B. In addition, based on one or more second commands from the managing device H, the second controller Hp issues one or more commands to one or more first purging devices 20A in the first container storage structure J1 or one or more second purging devices 20B in the second container storage structure J2, for their operations.

In addition, a resumption command station G which is configured to be operated manually is connected to the managing device H (see FIG. 3). The resumption command station G includes a keyhole and a specific key that fits in the keyhole. And, in response to a manual operation of inserting the key into the keyhole and turning the key, the resumption command station G issues a command to the second controller HP for causing the second controller to perform a supply resume operation which causes the resumption of the operation of the purging device 20 which was stopped by the abnormal-condition-time stop operation.

Note that examples of situations in which the operation of the purging device 20 can be caused to resume by the resumption command station G may include, for example, a situation in which a worker who was checking in the internal space A1 of the container storage structure J has been confirmed to have left the internal space A1 to the exterior space A2, and other situations in which operating the purging device 20 is confirmed to be permissible, among other situations.

In other words, the container storage facility of the present embodiment includes the first controller Hs configured to control the operations of the stacker cranes 10, the second controller Hp configured to control the operations of the purging devices 20, and the managing device H configured to transmit a first command which is a command related to an operation of a stacker crane 10 to the first controller Hs through the switching hub C and to transmit a second command which is a command related to the operations of one or more purging devices 20 to the second controller Hp through the switching hub C.

As shown with dashed lines in FIG. 4, the first stacker crane 10A in the first container storage structure J1 is configured to operate with the electric power supplied from a distribution board P1$a$ for transporting in the first storage structure, which distribution board P1$a$ is provided near, or adjacent, the first container storage structure J1. The first purging devices 20A in the first container storage structure J1 are configured to operate with the electric power supplied from a distribution board P1$b$ for purging in the first storage structure, which distribution board P1$b$ is provided near, or adjacent, the first container storage structure J1.

In addition, as shown with dashed lines in FIG. 4, the second stacker crane 10B in the second container storage structure J2 is configured to operate with the electric power supplied from a distribution board P2$a$ for transporting in the second storage structure, which distribution board P2$a$ is provided near, or adjacent, the second container storage structure J2. The second purging devices 20B in the second container storage structure J2 are configured to operate with the electric power supplied from a distribution board P2$b$ for purging in the second storage structure, which distribution board P2$b$ is provided near, or adjacent, the second container storage structure J2.

And, as shown with dashed lines in FIG. 4, to each of the distribution board P1$a$ for transporting in the first storage structure, the distribution board P1$b$ for purging in the first storage structure, the distribution board P2$a$ for transporting in the second storage structure, the distribution board P2$b$ for purging in the second storage structure, the first controller Hs, the second controller Hp, the managing device H, and the switching hub C is configured to receive electric power from a primary distribution board PM which has enough electrical power supplying capacity to operate all the container storage structures J in the semiconductor substrate processing plant. In addition, the primary distribution board PM may supply electric power to any other devices and portions, other than those mentioned above, that require electric power (for example, a transport vehicle V, an illuminating device, etc.). In addition, the primary distribution board PM is provided near, or adjacent to the locations of the container storage structures J.

In the present embodiment, each of the distribution board P1$a$ for transporting in the first storage structure and the distribution board P2$a$ for transporting in the second storage structure (distribution boards Pa for transporting) is, or corresponds to, the first electric power supply: each of the distribution board P1$b$ for purging in the first storage structure and the distribution board P2$b$ for purging in the second storage structure (distribution boards Pb for purging) is, or corresponds to, the second electric power supply: and the primary distribution board PM is, or corresponds to, the third electric power supply.

That is, each stacker crane 10 operates with the electric power supplied from the distribution board Pa for transporting. The purging devices 20, the second controller Hp, the managing device H, and the switching hub C operate with (i.e., operate using) electric power supplied from different-path electric power supplies each of which is an electric power supply to which electric power is supplied through one or more electric power supply paths that are different from the electric power supply path that supplies electric power to the distribution board Pa for transporting. Each electric power supply path may be formed by one or more electric wires. In addition, the different-path electric power supplies include the distribution board Pb for purging and the primary distribution board PM. Each purging device 20 operates with the electric power supplied from a distribution board Pb for purging. The second controller Hp, the managing device H, and the switching hub C operate with the electric power supplied from the primary distribution board PM.

Figure 5:
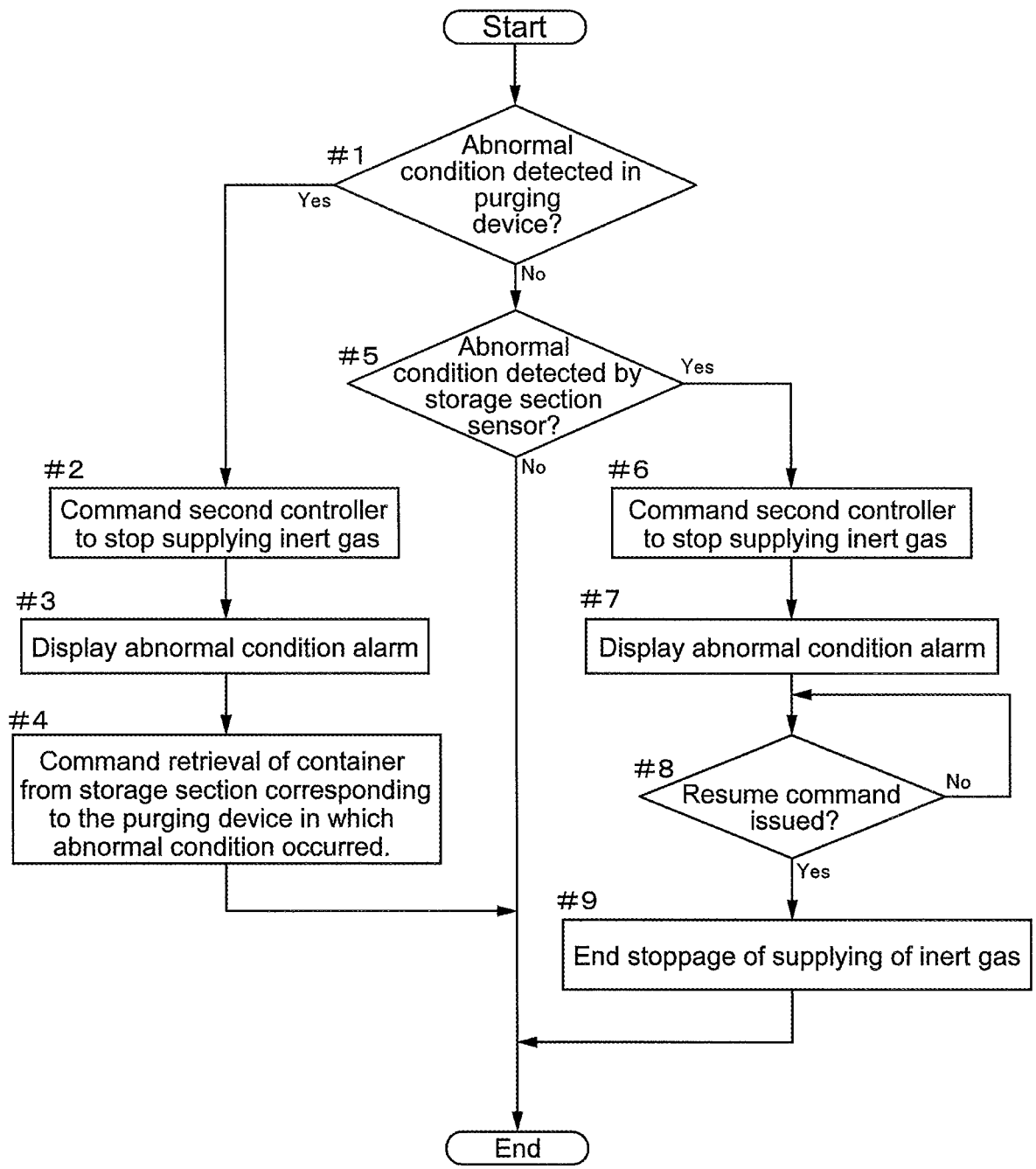
FIG. 5 is a flowchart showing a control procedure.
Figure 6:
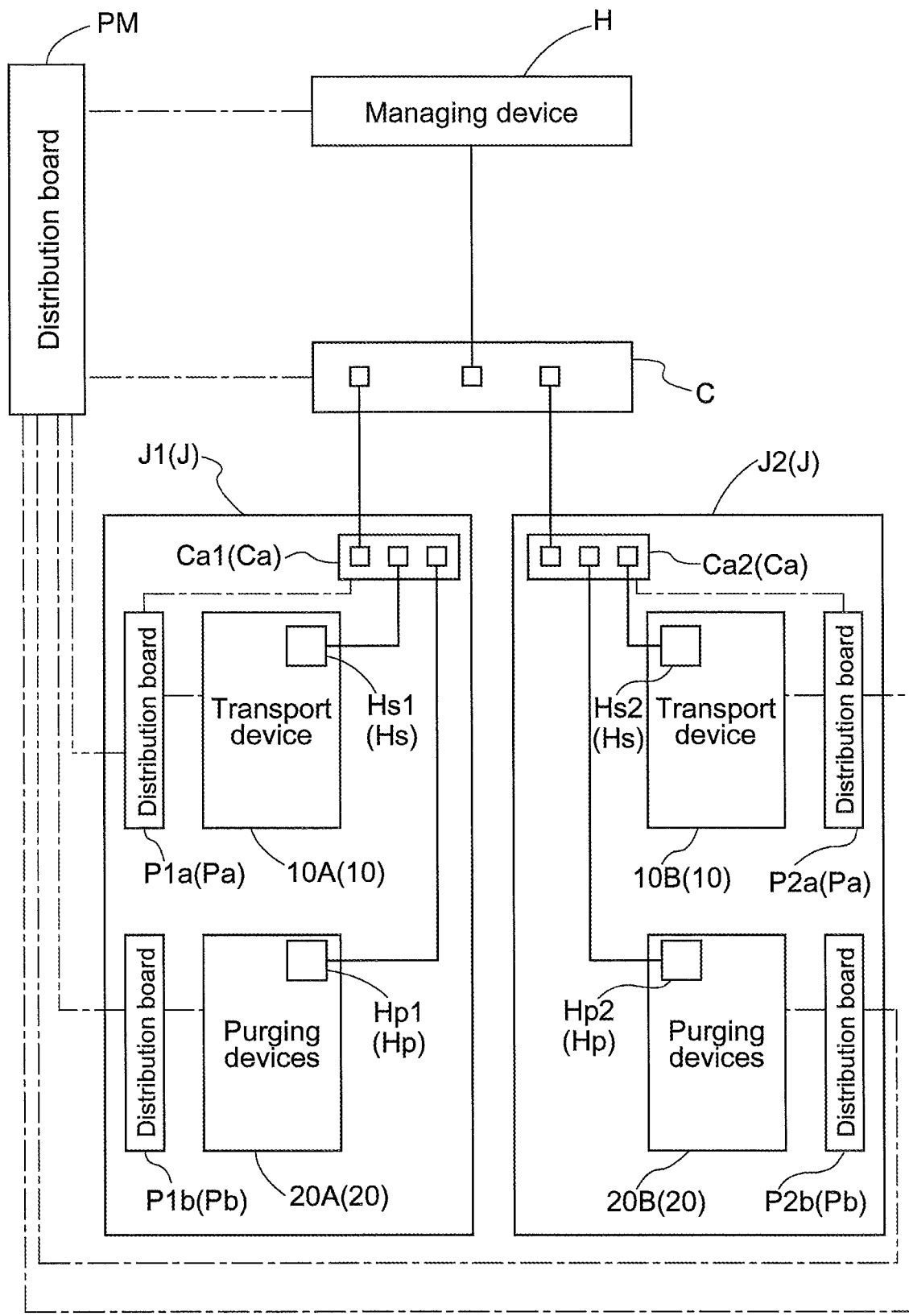
FIG. 6 is a block diagram showing an electric power supply paths for a conventional container storage structure.

The controls performed by the managing device H are described next with reference to the flowchart of FIG. 5.

If the managing device H detects an abnormal condition of a purging device 20 (Step #1: Yes), the managing device H issues a command to the second controller Hp to cause the second controller Hp to stop the operation of the purging device 20 to stop the supplying of inert gas (Step #2), and the managing device H causes an external display (not shown) to display a message indicating that an abnormal condition occurred in the purging device 20 (Step #3). The managing device H may detect an abnormal condition of each purging device 20 by means of a sensor (such as, among other conventional examples, a voltage sensor which can detect electric power supplied to the purging device 20 or a pressure sensor which can detect any changes in the pressure) provided to each purging device 20. However, instead of, or in addition to, displaying a message on the external display, an alarm lamp may be turned on. In the present embodiment, the operation in Step #2 is, or corresponds to, the abnormal-condition-time stop operation. After executing Step #3, the managing device H issues a command to the first controller Hs to cause the first controller Hs to perform an operation to retrieve the container B from the storage section S corresponding to the purging device 20 in which the abnormal condition occurred. Based on a command input by a worker, the retrieved container B may be stored in a storage section S with a purging device 20 in which any abnormal condition has not occurred, or may be transported to another transport destination. This allows for reducing the likelihood of situation in which inert gas cannot be supplied to the containers B stored in the storage sections S.

In addition, if there is no abnormal condition in the purging devices 20 (Step #1: No) and an abnormal condition is detected by a storage section sensor D (Step #5: Yes), the managing device H issues a command to the second controller Hp to cause the second controller Hp to stop the operations of the purging devices 20 to stop the supplying of inert gas (Step #6), and the managing device H causes the external display (not shown) to display a message indicating that an abnormal condition occurred in the purging devices 20 (Step #7). However, instead of, or in addition to, displaying a message on the external display, an alarm lamp may be turned on. Subsequently, if a resume command is issued by the resumption command station G (step #8; Yes), the managing device H cancels the non-supplying of inert gas (i.e. causes the supplying of inert gas to resume) (Step #9). In the present embodiment, the operation of Step #9 is, or corresponds to, the supply resume operation.

The managing device H completes the execution of the flowchart after the completion of Step #4 or Step #9, or, if it is determined in Step #5 that no abnormal condition is detected by the storage section sensors D (Step #5; No).

As such, even if an abnormal condition occurs in the stacker crane 10 in a container storage structure J or in the distribution board Pa for transporting which supplies electric power to the stacker crane 10, the supplying of electric power to the managing device H, the second controller Hp, and the purging device 20 can continue. Thus, with the arrangements in accordance with the present embodiment, even if an abnormal condition occurs in the stacker crane 10 or in the distribution board Pa for transporting, the purging devices 20 can continue to operate; thus, any likelihood of deterioration of the substrates in the containers B can be reduced.

Alternative Embodiments (1) In the embodiment described above, the inert gas supplied by inactive gas supplying devices is described to be nitrogen gas; however, the inert gas may be any of various kinds of gas (e.g., gaseous argon, dry air, etc.) that has the function of reducing deterioration of the objects held in the containers B.

(2) In the embodiment described above, an example is described in which the purging devices 20 operate with electric power supplied from a distribution board Pb for purging whereas the second controller Hp, the managing device H, and the switching hub C operate with electric power supplied from the primary distribution board PM. However, arrangements may be such that the purging devices 20, the second controllers Hp, the managing device H, and switching hubs C all operate with the electric power supplied from the primary distribution board PM. In addition, each of the second controller Hp, the managing device H, the switching hub C, and the purging devices 20 may be supplied with electric power by a distribution board provided separately for each, and provided separately from the distribution board Pa for transporting. In addition, each of the primary distribution board PM, the distribution board Pa for transporting, and the distribution board Pb for purging may be supplied with electric power through an electric power supply path that is independent and different from the electric power supply path for any other distribution board. That is, the electric power supply path for the distribution board Pb for purging and the electric power supply path for the primary distribution board PM may be different from each other. In this case, the electric power line from an electric power company that is used to draw electricity into the facility may be provided separately for each of the primary distribution board PM, the distribution board Pa for transporting, and the distribution board Pb for purging. Alternatively, one of these distribution boards may be connected to and draw electric power from an in-house electric generator etc.

(3) In the embodiment described above, an example is described in which each of the first electric power supply, the second electric power supply, and the third electric power supply is a distribution board. However, one or more of such electric power supplies may be electric power supply or supplies (for example, electric power switch board, or battery, etc.) other than a distribution board.

(4) In the embodiment described above, an example is described in which the primary distribution board PM that supplies electric power to the second controller Hp, the managing device H, and the switching hub C is provided near or adjacent the container storage structure J. However, the primary distribution board PM may be provided near or adjacent the location where the electric power line, that is used to draw electric power from an electric power company into the facility, enters the building. In addition, the electric power to the second controller Hp, the managing device H, and the switching hub C may be supplied from one or more distribution boards, or switch boards, etc., that are installed at locations outside the building in which the container storage structure J is installed. As such, the second controller Hp, the managing device H, and the switching hub C may be configured to be supplied with electric power from any desired electric power supply path or paths so long as the electric power is not from the distribution board Pa for transporting. In addition, also in this case, it is desirable that the electric power supply path or paths has or have sufficient electric power supplying capacity and dependability.

(5) In the embodiment described above, an example is described in which a plurality of the purging devices 20 each of which functions as an inactive gas supplying device such that one purging device 20 is provided to each storage section S. However, the purging devices 20 may be provided to only one or more of the plurality of storage sections S. In addition, in the embodiment described above, an example is described in which each purging devices 20 is provided to the corresponding storage section S. However, a purging device 20 may be provided to the internal space A1 which is defined by the walls W.

(6) In the embodiment described above, an example is described in which the communications relay device is a switching hub C. However, the communications relay device is not limited to such a hub C and may be any device that is capable of relaying communication between the first controller Hs, the second controller Hp, and the managing device H. For example, the communications relay device may be a repeater hub without a switching function.

(7) In the embodiment described above, an example is described in which the resumption command station G includes a keyhole and a key that fits in the keyhole, and issues a command for causing the resumption of the supplying of inert gas. However, the command for resuming the supplying of inert gas may be realized by any other arrangement. For example, resumption of the supplying of inert gas may be commanded by a manual operation of clicking on an icon for issuing a resume command which is displayed on a display of the managing device H, by means of a pointer device, such as a mouse. Alternatively, resumption of the supplying of inert gas may be commanded by a manually pushing on a button for issuing a resume command.

(8) In the embodiment described above, an example is described in which the storage rack R is surrounded by the walls W. However, the storage rack R does not need to be surrounded by the walls W. On or more purging devices 20 are provided to the storage rack R in either case.

In addition, in the embodiment described above, an example is described in which each storage rack R includes a plurality of storage sections S arranged one above another along a vertical direction and one next to another along a right-and-left (or lateral) direction. However, the plurality of storage sections S may be arranged one above another only along a vertical direction or one next to another only along the right-and-left direction. In addition, the plurality of storage sections S may be located such that they are spaced apart from each other. In any of these cases, each purging device 20 is preferably provided to, and mounted in, the storage rack R or one or more storage sections S.

Furthermore, the storage rack R may include only one storage section S to which the purging device 20 is provided.

(9) In the embodiment described above, an example is described in which the container storage facility includes two container storage structures J. However, the container storage facility may include only one container storage structure J or, alternatively, three or more container storage structures J.

(10) In the embodiment described above, an example is described in which each container B to be stored in the container storage structure J is a FOUP which can hold one or more semiconductor substrates. However, each container B may be a FOSB (Front Opening Shipping Box). In addition, the substrates held in the containers are not limited to semiconductor substrates and may be, for example, photomasks or reticles, etc., in which photo lithography patterns for semiconductor substrates are formed on a transparent quartz substrate, etc. In such a case, each container B may be a reticle container, etc.

Summary of Embodiments Described Above

A brief summary of the container storage facility described above is provided next.

A container storage facility comprises: a storage section configured to store a container for holding one or more semiconductor substrates; an inactive gas supplying device configured to supply inert gas to a container stored in the storage section; a transport device configured to carry a container into, and out of, the storage section; a first controller configured to control operation of the transport device; a second controller configured to control operation of the inactive gas supplying device; and a third controller configured to transmit a first command to the first controller through a communications relay device, and to transmit a second command to the second controller through the communications relay device, wherein the first command is a command related to an operation of the transport device, wherein the second command is a command related to an operation of the inactive gas supplying device, wherein the transport device is configured to operates with electric power supplied from a first electric power supply, and wherein the inactive gas supplying device, the second controller, the third controller, and the communications relay device are configured to operate with electric power supplied from one or more different-path electric power supplies each of which is an electric power supply to which electric power is supplied through corresponding one or more electric power supply paths each of which is different from an electric power supply path for supplying electric power to the first electric power supply.

That is, each of the inactive gas supplying device, the second controller, the third controller, and the communications relay device operates with electric power supplied from the one or more different-path electric power supplies. Thus, even if any abnormal condition occurs in the first electric power supply and thus the first electric power supply becomes unable to supply electric power, the inactive gas supplying device can be operated by a command from the third controller.

Therefore, even if it becomes impossible to take out a container from a storage section because the transport device cannot operate because of the abnormal condition that occurred in first electric power supply, inert gas can still be supplied to the container in the storage section by the inactive gas supplying device until the first electric power supply is restored so that it can supply electric power normally. Thus, any likelihood of deterioration of the one or more substrates in the container can be reduced.

Therefore, with the arrangement described above, any likelihood of deterioration of the one or more substrates in the container can be reduced even when an abnormal condition occurs in the electric power supply system for the facility.

Here, the one or more different-path electric power supplies preferably include a second electric power supply and a third electric power supply which are electric power supplies such that an electric power supply path through which electric power is supplied to the second electric power supply is independent from an electric power supply path through which electric power is supplied to the third electric power supply, wherein the inactive gas supplying device preferably operates with electric power supplied from the second electric power supply, and wherein the second controller, the third controller, and the communications relay device preferably operate with electric power supplied from the third electric power supply.

That is, the third electric power supply (which supplies electric power to the third controller which issues a command to the second controller for the operation of the inactive gas supplying device, and to the communications relay device which relays the command) receives electric power from the electric power supply path which is independent from the second electric power supply which supplies electric power to the inactive gas supplying device. Therefore, for example, even if an abnormal condition occurs only in the second electric power supply, third electric power supply may be operating normally since the electric power supply path of the third electric power supply is independent from the electric power supply path of the second electric power supply. In such a case, the third controller can issue a command to the first controller to take out and move the container. Therefore, even if it becomes impossible to supply inert gas to the container stored in the storage section because of the abnormal condition that occurred in the second electric power supply, the container can be moved to another storage section if an inactive gas supplying device for that storage section is operating normally. In addition, the container can also be taken out of the storage section to transport the container to a location for processing the one or more substrates.

In addition, the container storage facility preferably further comprises a storage section sensor configured to detect an abnormal condition related to the storage section, wherein the first controller preferably transmits to the second controller first abnormal condition information which is based on detection information from the storage section sensor, wherein the second controller preferably performs an abnormal-condition-time stop operation for stopping operation of the inactive gas supplying device if inert gas is being supplied to the container by the inactive gas supplying device when the second controller receives the first abnormal condition information.

That is, the operation of the inactive gas supplying device can be stopped if an abnormal condition related to the storage section is detected. For example, an abnormal condition related to the storage section is detected, for example, if it becomes impossible to take out the container from the storage section because of an abnormal condition in the first electric power supply which supplies electric power to the transport device, or if the supporting position or attitude of the container in the storage section is abnormal. Thus, when an abnormal condition related to a storage section occurs, a worker may sometimes enter the storage structure provided with the storage section to check the state of the storage section. With the arrangement of the present invention, the safety of the worker who enters the storage structure is ensured since the operation of the inactive gas supplying device is stopped when the abnormal condition related to the storage section occurs.

In addition, the container storage facility preferably further comprises a resumption command station configured to be operated manually, wherein, in response to a manual operation, the resumption command station preferably issues a command to the second controller for causing the second controller to perform a supply resume operation for causing a resumption of operation of inactive gas supplying device which was stopped by the abnormal-condition-time stop operation.

That is, if, after the abnormal condition related to the storage section was detected and the operation of the inactive gas supplying device was stopped, a worker is able to confirm that the abnormal condition had been resolved so that inert gas can be supplied again, the operation of the inactive gas supplying device can be resumed by means of the resumption command station that can be operated manually. Therefore, a situation can be avoided in which the supplying of inert gas remains stopped in spite of the fact that the situation is such that the supplying of inert gas to the container can be resumed. Therefore, any likelihood of deterioration of the one or more substrates in the container can be advantageously reduced.

What is claimed is:

1. A container storage facility comprising:
   a storage section configured to store a container for holding one or more semiconductor substrates;
   an inactive gas supplying device configured to supply inert gas to a container stored in the storage section;
   a transport device configured to carry a container into, and out of, the storage section;
   a first controller configured to control operation of the transport device;
   a second controller configured to control operation of the inactive gas supplying device; and
   a third controller configured to transmit a first command to the first controller through a communications relay device, and to transmit a second command to the second controller through the communications relay device,
   wherein the first command is a command related to an operation of the transport device,
   wherein the second command is a command related to an operation of the inactive gas supplying device,
   wherein the transport device is configured to operates with electric power supplied from a first electric power supply, and
   wherein the inactive gas supplying device, the second controller, the third controller, and the communications relay device are configured to operate with electric power supplied from one or more different-path electric power supplies each of which is an electric power supply to which electric power is supplied through corresponding one or more electric power supply paths each of which is different from an electric power supply path for supplying electric power to the first electric power supply, wherein the one or more different-path electric power supplies include a second electric power supply and a third electric power supply, wherein the third electric power supply is configured to supply electric power to the first electric power supply and the second electric power supply which are provided independently of each other, and supply electric power to the first controller, the second controller, the third controller, and the communications relay device, independently of the first electric power supply and the second electric power supply, wherein the inactive gas supplying device operates with electric power supplied from the second electric power supply, and wherein the second controller, the third controller, and the communications relay device operate with electric power supplied from the third electric power supply.

2. A container storage facility comprising:

a storage section configured to store a container for holding one or more semiconductor substrates;

an inactive gas supplying device configured to supply inert gas to a container stored in the storage section;

a transport device configured to carry a container into, and out of, the storage section;

a first controller configured to control operation of the transport device;

a second controller configured to control operation of the inactive gas supplying device;

a third controller configured to transmit a first command to the first controller through a communications relay device, and to transmit a second command to the second controller through the communications relay device; and a storage section sensor configured to detect an abnormal condition related to the storage section, wherein the first command is a command related to an operation of the transport device, wherein the second command is a command related to an operation of the inactive gas supplying device, wherein the transport device is configured to operate with electric power supplied from a first electric power supply, wherein the inactive gas supplying device, the second controller, the third controller, and the communications relay device are configured to operate with electric power supplied from one or more different-path electric power supplies, each of which is an electric power supply to which electric power is supplied through corresponding one or more electric power supply paths, each of which is different from an electric power supply path for supplying electric power to the first electric power supply, wherein the first controller transmits to the second controller first abnormal condition information which is based on detection information from the storage section sensor, and wherein the second controller performs an abnormal-condition-time stop operation for stopping operation of the inactive gas supplying device if inert gas is being supplied to the container by the inactive gas supplying device when the second controller receives the first abnormal condition information.

3. The container storage facility as defined in claim 2, further comprising:

a resumption command station configured to be operated manually, wherein, in response to a manual operation, the resumption command station issues a command to the second controller for causing the second controller to perform a supply resume operation for causing a resumption of operation of inactive gas supplying device which was stopped by the abnormal-condition-time stop operation.

* * * * *